(12) United States Patent
Bash et al.

(10) Patent No.: US 6,604,370 B2
(45) Date of Patent: *Aug. 12, 2003

(54) VARIABLY CONFIGURED SPRAYJET COOLING SYSTEM

(75) Inventors: Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/943,942

(22) Filed: Aug. 31, 2001

(65) Prior Publication Data

US 2002/0112496 A1 Aug. 22, 2002

Related U.S. Application Data

(60) Provisional application No. 60/271,278, filed on Feb. 22, 2001.

(51) Int. Cl.[7] .............. F28D 3/00; F25D 23/12; H05K 7/20
(52) U.S. Cl. .............. 62/171; 62/64; 62/259.2; 361/699
(58) Field of Search .............. 62/171, 64, 259.2, 62/132, 118, 119; 165/104.33, 908; 236/75; 239/132.5; 361/699, 689, 698, 719, 721

(56) References Cited

U.S. PATENT DOCUMENTS

| | | | |
|---|---|---|---|
| 5,212,975 A | | 5/1993 | Ginzburg ............ 72/43 |
| 5,247,426 A | | 9/1993 | Hamburgen et al. ...... 361/705 |
| 5,797,274 A | * | 8/1998 | Jackaman et al. ........ 62/171 |
| 5,992,159 A | * | 11/1999 | Edwards et al. .......... 62/64 |

* cited by examiner

Primary Examiner—Chen Wen Jiang

(57) ABSTRACT

A modular semiconductor chip cooling system having a readily openable enclosure defining a chamber configured to hold a printed circuit board carrying components to be cooled. The enclosure can include a reservoir, a condenser and a pump. Sprayers within the chamber are set in an array to spray a target area, and a controller controls which sprayers are activated based on information delineating the locations of the components to be cooled. The enclosure can be readily removed from a computer system through a quick release connection. The computer system can include a condenser and pump to operate all its modular cooling systems, removing the condensing function from the individual modules.

41 Claims, 5 Drawing Sheets

VARIABLY CONFIGURED SPRAYJET COOLING SYSTEM

The present application claims priority from U.S. provisional patent application, Serial No. 60/271,278, filed Feb. 22, 2001, which is incorporated herein by reference for all purposes.

The present invention relates generally to cooling systems for heat-generating devices and, more particularly, to a spray cooling system and a method of using the spray cooling system to cool semiconductor devices.

BACKGROUND OF THE INVENTION

With the advent of semiconductor devices having increasingly large component densities, the removal of heat generated by the devices has become an increasingly challenging technical issue. Extrapolating the ongoing changes in microprocessor organization and device miniaturization, one can project future power dissipation requirements of 100 W from a 1 cm by 1 cm core CPU surface area within the easily foreseeable future.

Typical processor boards sometimes include multiple CPU modules, application-specific integrated circuits (ICs), and one or more types of memory such as static random access memory (SRAM), as well as dc—dc converters, all of which have different and extreme power dissipation requirements. Adding to the complexity, the variety of chip types on typical processor boards provides for chip surfaces at a variety of heights off the board's surface.

Highly available computer systems, to prolong a customer's investment, are designed to both be maintained for long periods and to be easily maintained over time. This makes it preferable that a computer system is well cooled across all of its components on each board, and that the computer can quickly and readily accept upgrades for boards as they become available. The evolution of the design may include one or more of the following: new or additional components, changes in existing component locations, and increased power dissipation due to technology changes.

In the past, the low power dissipation of the processors accommodated the use of low cost, air-cooled heat sinks that require minimal re-design effort. However, with higher dissipation requirements come more complex cooling systems that make both the even cooling requirements and the serviceability of a board a more complex issue. In particular, board upgrades will typically have different layouts of chips with different dissipation requirements, thus requiring cooling systems that adapt to the layouts and requirements of the new board while providing high levels of heat dissipation.

Spray cooling technologies can offer high dissipation levels that meet extreme cooling requirements. With reference to FIG. 1, in spray cooling, an inert spray coolant from a reservoir 11 is preferably sprayed by a group of one or more sprayers 13 onto an aligned group of one or more chips 15 mounted on a printed circuit board 17. The coolant preferably evaporates, dissipating heat within the chip. The sprayers and chips, and the board, are mounted within sealed cases 19 fixed within a computer system. The sprayed coolant is typically gathered and cooled within a condenser 21, and then routed back to the reservoir by a pump 23.

The cases are evacuated systems with sprayers fixed at locations conforming to the layout of the respective chips to be cooled, and targeted toward those chips. Thus, for a liquid cooled board, board-upgrading becomes a complex issue that would typically be dealt with by replacing the sprayer set with a new set configured for the new board.

It is known that the thermal performance achieved from spray cooling is dependant upon the spraying distance between the sprayer and the hot surface of the chip. A greater distance allows for more of the cooling fluid to evaporate prior to reaching the chip. Furthermore, drag reduces the speed of the droplets, allowing even more cooling fluid to evaporate prior to reaching the chip. The evaporation of cooling fluid prior to reaching the chip reduces the fluid flow rate received by the chip, and thus reduces the thermal performance of the spray cooling system. The reduced speed of the droplets also reduces their momentum, and thus their ability to penetrate vapor barriers, such as can form at near-local-maximum levels of heat flux for a spray-cooling system. As a result, the height of the sprayers off the board is typically set to be the optimal height for cooling the hottest and/or most critical chip on the board.

Upgrading the board is further complicated by this issue of sprayer height off the board (and its chips). Because the hottest chip of a new set of chips would likely have a different height, temperature, and location on its respective board (as opposed to the hottest chip on the original set), the height of the sprayers off the board would typically need to be adjusted accordingly for each board change.

Accordingly, there has existed a need for an easily maintainable spray cooling system that maximizes spray cooling efficiency for a plurality of components on a single printed circuit board, while being adaptable to new board layouts. Preferred embodiments of the present invention satisfy these and other needs, and provide further related advantages.

SUMMARY OF THE INVENTION

In various embodiments, the present invention solves some or all of the needs mentioned above, providing a cooling system that can efficiently adapt to cool a variety of component configurations with little or no reconfiguration of hardware.

The invention can include or form a cooling system for cooling one or more hot portions of one or more heat-producing components, such as semiconductor devices, on a board by spraying the components with a cooling fluid during the components' operation. The hot portions of the heat-producing components cover sections of a target area, while not covering other portions of the target area. The target area can be a substantial portion of a side of a printed circuit board. The cooling system of the invention includes two or more structurally interconnected spray-cooling nozzles configured to eject droplets of cooling fluid targeted throughout the target area.

The invention features a controller to control the nozzles, the controller being configured to use information that delineates the sections of the target area covered by the hot portions of the heat-producing components. At the controller's direction, a first group of one or more nozzles is energized to be substantially active, while a second group of one or more nozzles is substantially inactive. The first group is targeted such that they can cool the hot portions of the heat-producing components, while the second group is targeted at sections of the target area that are not covered by the hot portions of the heat-producing components (i.e., they are not targeted to cool hot portions of the heat-producing components).

Advantageously, this feature of the invention allows the cooling system to be configurable for a wide variety of component layouts. To change the system's configuration for a new layout, the cooling system must generally be programmed or otherwise provided with new information delineating the portions of the new layout that need to be cooled. That information can optionally be provided by the new board. Incremental sprayers, and particularly inkjet-type sprayers, are particularly useful for this feature because of their inherent controllability.

The invention further features an enclosure that defines an internal chamber configured to contain the board. An electrical connector within the chamber is configured to electrically connect to the board, enabling the operation of the components. The nozzles are located within the chamber.

In a first variation, the chamber can be readily opened and closed by hand for external access to the chamber. When the chamber is opened, the board can be readily removed and replaced by hand. During operation, the chamber is closed and sealed such that cooling fluid cannot leak out of the chamber. This feature provides for efficient replacement of the board, potentially without shutting down the entire system of which the board is a part, i.e., making it hot-pluggable. This feature, in combination with the first feature, typically provides a spray cooling system that allows for boards to be efficiently upgraded without mechanically reconfiguring the system.

In a second variation, the enclosure can be configured for releasably inserting into a bay of an electronic device, the bay having an electrical connector. The enclosure includes a second electrical connector on the exterior of the enclosure, configured to mate with the electrical connector of the bay to place the board in communication with the electronic device via the first electrical connector. This feature provides for efficient replacement of the combined board and cooling system with another, potentially without shutting down the entire system of which the board is a part. The cooling system can then receive a new board, possibly with a different layout, and be used again.

Additionally, the invention advantageously features the controlled operation of the first group of sprayers such that the cooling system adjusts their flow rates to compensate for their distances from each cooled component. This feature provides for efficient and effective cooling of the components on the board, allowing for each component's height.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather, it is intended to provide particular examples of them.

Typical embodiments of the present invention reside in a cooling system that is adaptable to cool hot portions of various heat-producing components at various component locations, having various heat dissipation requirements. Preferred embodiments of the invention are assemblies that are flexible with respect to their ability to adapt to the number, relative positions, and power dissipation of the components being cooled on one or more printed circuit boards, thereby enabling the use of a single spray cooling system for the cooling of a variety of different processor board layouts. With this technology, a computer system can preferably undergo a circuit board upgrade without requiring a cooling solution upgrade, or at least with a less invasive upgrade.

Figure 1:
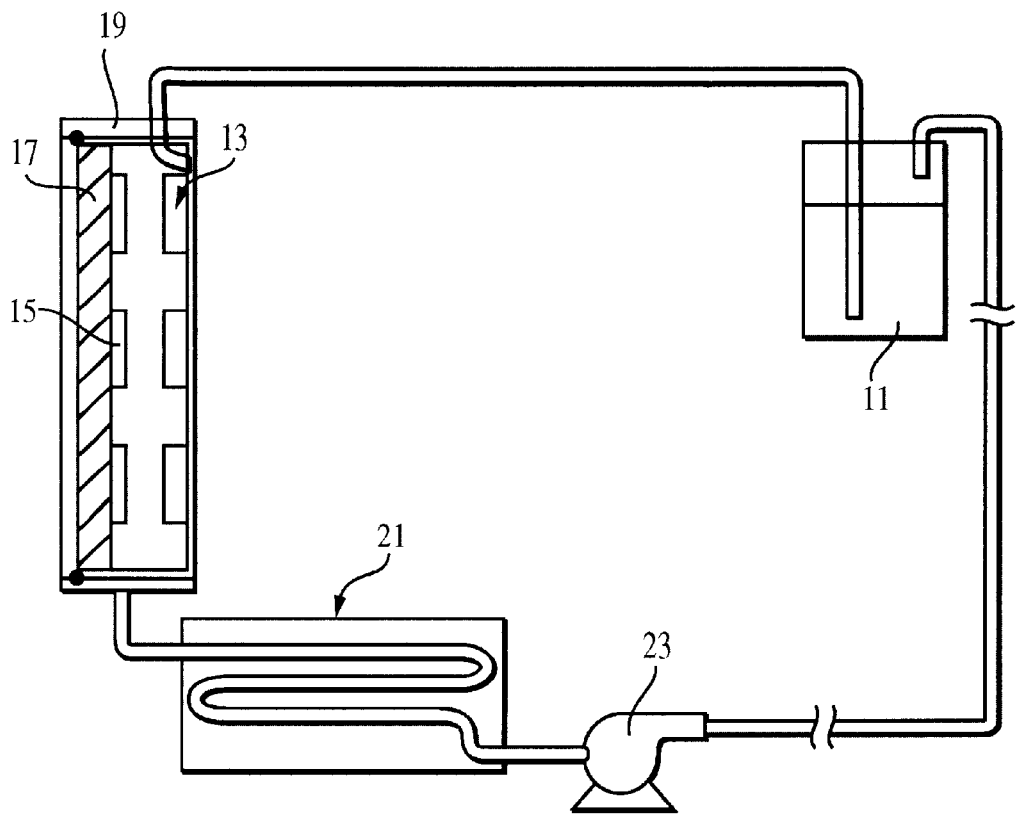
FIG. 1 is a system layout of a spray cooling system.
Figure 2:
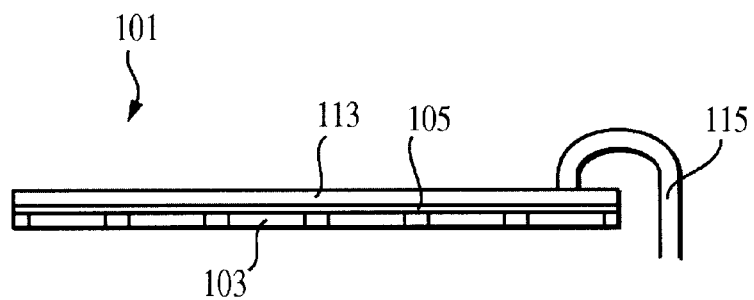
FIG. 2 is an elevation view of a spray cooling system oriented for vertical spraying, embodying the invention.
Figure 3:
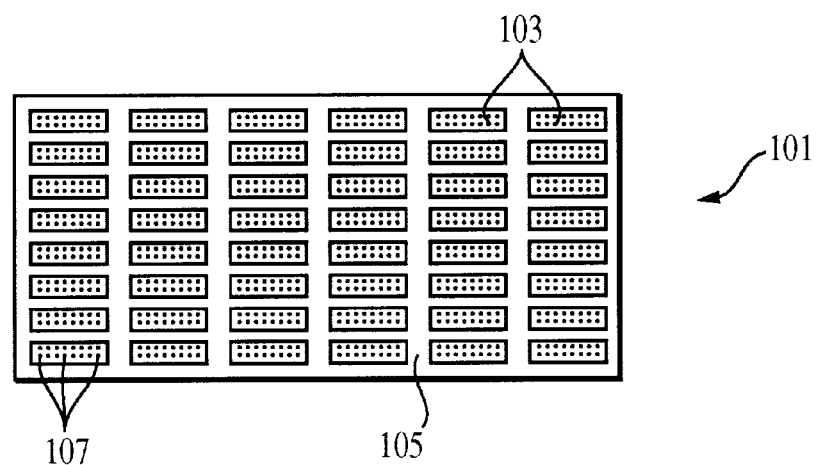
FIG. 3 is a bottom plan view of the spray cooling system depicted in FIG. 2.
Figure 4:
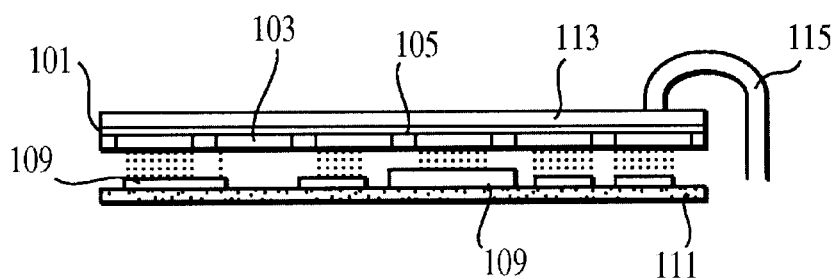
FIG. 4 is an elevation view of the spray cooling system depicted in FIG. 2, operating to cool components on a printed circuit board.

With reference to FIGS. 2–4, a first embodiment of the invention is a preferably planar cooling system cartridge 101 comprising one or more sprayer arrays 103 attached to and structurally interconnected by a substrate 105. Each sprayer array includes a plurality of sprayers having nozzles 107 configured and targeted for ejecting droplets of cooling fluid onto components 109 throughout a target area on a preferably planar circuit board 111 that is preferably in a plane parallel to the plane of the cooling system cartridge. Preferably, the length and width of the cartridge are approximately the length and width of the circuit board, but optionally it can be larger or smaller depending on the size of the preferred target area.

The cooling fluid is preferably fed to the sprayer arrays from an internal reservoir 113 located adjoining and above the arrays. Alternatively, the reservoir can be located next to or even below the arrays, so long as it is either kept adequately full, pumped or pressurized such that fluid is delivered to the sprayer arrays. For example, optionally the cartridge can be oriented for lateral or even upside-down spraying. For lateral spraying, the reservoir preferably includes a level indicator to ensure that cooling fluid fills the reservoir to an adequate level to feed all functioning nozzles, and/or it is preferably relocated, pressurized or otherwise configured to adequately feed cooling fluid to the sprayers.

The cartridge's internal reservoir 113 is preferably connected to a fluid supply tube 115. The supply tube supplies condensed coolant to the reservoir via a pump (not shown). The pumped coolant preferably comes from a cooler/condenser, which receives, and removes heat from, vaporized cooling fluid after it has been sprayed. The cooling fluid contained in the reservoir feeds the individual arrays 103 of nozzles 107 via small fluid passages (not shown) connecting the sprayer arrays (and individual nozzles) to the reservoir.

The plurality of nozzles 107 of each of the one or more sprayer arrays 103 are preferably configured to eject cooling fluid in a direction parallel to one another and normal to the plane of the cooling system cartridge 101 toward target area on the circuit board 111. The sprayer arrays are closely situated and spray throughout the target area, i.e., they are preferably configured such that nearby nozzles on adjacent sprayer arrays can spray closely to each other to avoid leaving a thermally significant gap between their spray patterns.

The resulting spray pattern from the full set of sprayer arrays creates a spray footprint on the circuit board, such that preferably all of the hot components 109 that should be cooled lie within the footprint. Preferably the footprint covers a substantial portion, or even all, of the circuit board, and is unitary rather than being divided into a number of separate portions. Preferably the cooling system cartridge 101 is configured with an overall thickness of less than one inch.

The operation of each nozzle 107 on each sprayer array 103 contained on the cartridge 101 can be controlled independently by a controller (not shown). The controller uses information delineating the sections of the target area covered by the one or more hot portions of the components, thereby allowing cooling fluid to be sprayed only in the sections of the target area where it is required for cooling. This information can be provided to the controller and/or stored by the controller in a variety of ways. For example, the card 111 could directly provide the information to the controller. Likewise, the card could contain the controller. Alternatively, the electronic system containing the cooling system could include the information in its general configuration information.

As depicted in FIG. 4, the controller can selectively energize only a first group of sprayer nozzles that target the one or more hot portions of the one or more hot components 109, and not a second group of sprayer nozzles that would spray on cooler components or thermally more neutral portions of the board (i.e., at sections of the target area not covered by the one or more hot portions of the one or more heat-producing components). The first group becomes and/or remains substantially active, while the second group becomes and/or remains substantially inactive.

The first and second groups are preferably mutually exclusive groups that comprise all of the nozzles. Thus, the cooling system provides an adaptable spray-cooling footprint that adapts to the layout of the board. Of course, if the board is replaced with an upgraded board with a new layout, the controller can selectively energize different sprayers such that the cooling system adapts its cooling footprint to the cooling requirements of the new board. This upgrade can be accomplished by upgrading the controller software and/or its data. This upgrade, or even the permanent copy of the software and/or data can optionally be stored on the components carried on the board.

Figure 5:
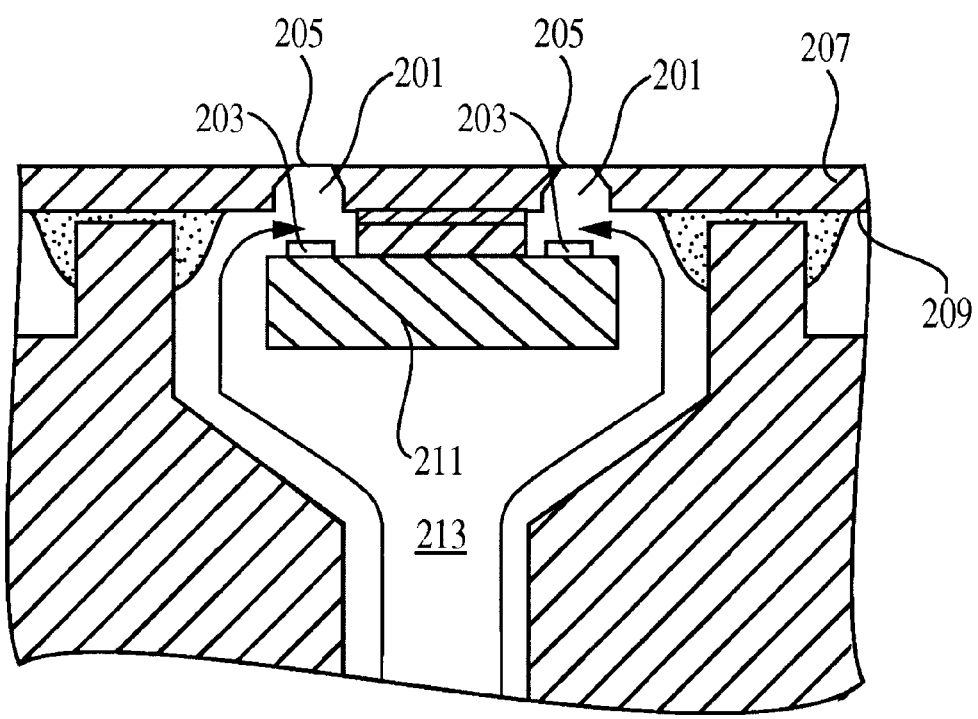
FIG. 5 is a cross-sectional view of a pair of incremental sprayers as used in the cooling system depicted in FIG. 2.

With reference to FIGS. 3 and 5, preferably the plurality of nozzles 107 in each of the sprayer arrays 103 are incremental sprayers that conduct incremental spraying (i.e., the nozzle sprays in incremental amounts of fluid in response to a control signal, such as from a computerized controller). More preferably, the sprayers are of the thermal inkjet type. In particular, with reference to FIG. 5, which depicts two simplified, exemplary incremental thermal inkjet-type nozzles, each nozzle includes structure defining a chamber 201 for receiving a predetermined portion of cooling fluid and a heater 203 for vaporizing a portion of the cooling fluid, to create the pressure to eject an incremental amount of the cooling fluid through an orifice 205 that directs the ejected cooling fluid toward the hot component 109 (FIG. 4). The orifices are preferably formed in a flexible polymer tape 207, e.g., a polyimide tape such as is sold under the mark KAPTON.®

Affixed to a back surface 209 of the tape 207 is a silicon substrate 211 containing the heaters 203, in the form of individually energizable thin-film resistors. Each heater is preferably located on a side of the chamber 201 across from the chamber's orifice 205. Cooling fluid is preferably drawn and loaded into the chamber by capillary action, as is typical for an ink-jet type device. A computerized controller (not shown) energizes the heater with a control signal, vaporizing the portion of the cooling fluid adjacent to the heater. Optionally, the controller can be a part of one or more cooled chips 109 (FIG. 4). When the portion of the cooling fluid is vaporized, it expands, expelling most of the non-vaporized cooling fluid out of the orifice, typically as a single droplet.

Depending on the configuration of the sprayer, the incremental amount of the fluid sprayed from the sprayer could be as a single droplet, or as multiple droplets. Multiple droplets could be produced by multiple orifices related to a single heater, or by sprayers having larger chamber volumes and appropriately shaped orifice nozzles to cause the incremental amount of fluid to break into droplets. After the chamber has been fired by the heater, capillary action again loads the chamber for a subsequent firing.

The liquid spray from the incremental sprayers can be highly controllable. For example, by increasing or decreasing the frequency that the sprayers are energized, the flow rate can be accurately adjusted. Furthermore, because the sprayers can be configured to deliver very small quantities of cooling fluid, and because many sprayers can be fit into a small area, the heat distribution over that area can be accurately controlled by energizing some sprayers at a rate greater than that of other sprayers, or by controlling the rates of each controller. Thus, the nozzles over different chips, or over thermally different portions of chips, can adjust different power dissipation levels on different chips or portions of chips without necessarily causing pooling, puddling or dry out on some chips. This high level of controllability is accomplished quite simply by a controller for an incremental sprayer, and is very cost effective.

The distance between the hot components 109 and the nozzles 107 of the cartridge 101 will vary according to the specific, non-uniform heights of the components. Without compensation, such variation could lead to uneven spray cooling of components having similar thermal requirements. The nozzles are preferably set at an optimal distance for a selected, thermally critical component, such as one characterized by the highest heat flux, the highest power level, the greatest temperature sensitivity, or the like. Alternatively, it can be set to the tallest component to provide for ease of maintenance and/or superior adaptability to different board configurations during an upgrade.

The varying heights are accommodated by selectively spraying the cooling fluid at greater or lesser flow rates (e.g., by firing the nozzles at higher or lower frequencies) when their distances from their respective chip(s) are greater or lower, respectively, due to the height of the chips. This can increase the fluid flow rate to make up for losses, such as due to evaporation over a distance, or decrease the fluid flow rate where appropriate. Additionally, local fluid flow spray rates within the cartridge can be adjusted in real time according to varying power dissipation level requirements on the circuit board, e.g., based on the local spray cooling regime, the particular chips' present usage or its present temperatures.

Figure 6:
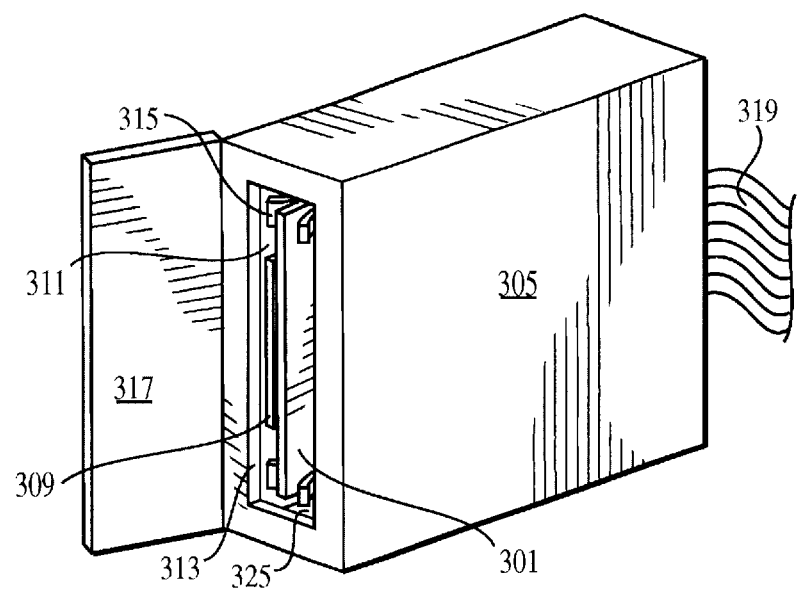
FIG. 6 is a perspective view of a modular board system incorporating the spray cooling system depicted in FIG. 2, with the spray cooling system oriented for lateral spraying.
Figure 7:
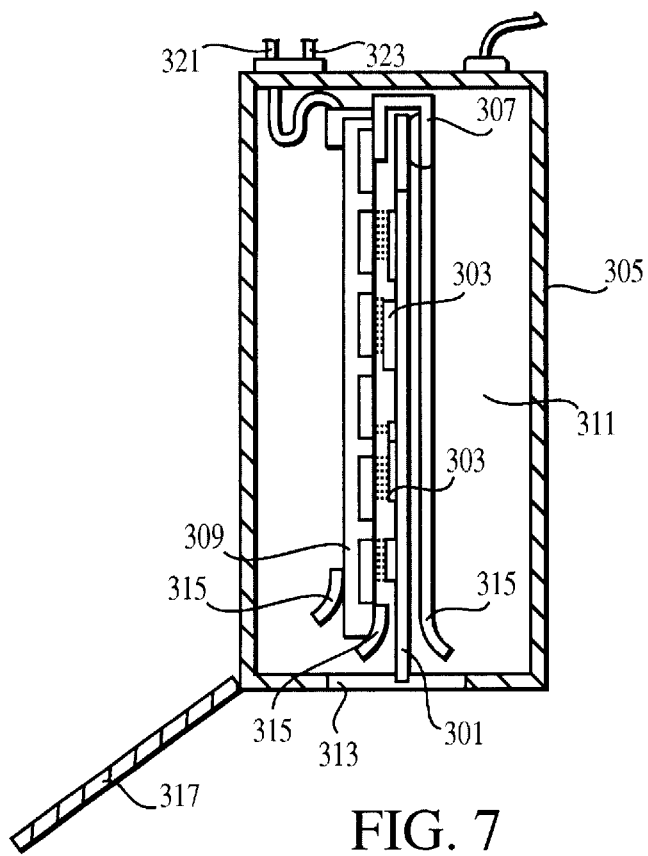
FIG. 7 is a cross-sectional plan view of the modular board system of FIG. 6.

With reference to FIGS. 6 and 7, a second preferred embodiment of the invention resides in a modular sprayjet cooling system. One or more modules of this embodiment can be installed as part of an electronic device (not shown), such as a computer system, to provide for the use of spray cooled printed circuit boards that can be quickly and easily serviced and replaced. The module is designed to contain a printed circuit board 301 carrying one or more chips 303, and it includes the cooling system of the present invention for cooling the chips with a cooling fluid while the chips are in operation.

The embodiment includes an enclosure 305, a connector 307 and a cooling system cartridge 309. The enclosure defines an internal chamber 311, the chamber being configured to contain the board 301 and the cartridge. The cooling system cartridge is located within the chamber, and is positioned and configured to spray the one or more chips on the board with cooling fluid during the chips' operation. The chamber can be readily opened and closed by hand for external access to the chamber. This access allows printed circuit boards to be removed and replaced while the chamber is opened. However, when the chamber is closed, the chamber is sealed such that cooling fluid cannot leak out of the chamber. The connector 307 is located within the chamber, and it is preferably configured both to connect the electronics to enable the operation of the one or more chips 303, and to connect both the fluid and electronics for the operation of the cooling system cartridge. Advantageously, this configuration provides for the efficient replacement of the board, potentially without shutting down the electronic device. Thus, the invention allows for hot-plugable replacement boards that are spray cooled.

The enclosure 105 is preferably configured as a six-sided box with an opening 313 on one side. The opening is large enough for both the printed circuit board 301 and the cooling system cartridge 309 to pass through unobstructed. The enclosure is preferably mounted in a case of the electronic device such that the enclosure's opening can be opened and the board or cartridge removed without any disassembly of the rest of the electronic device (or only insubstantial access-related activities such as opening an access door). Preferably there is a plurality of such modules in the electronic device, each preferably being similarly mounted and readily accessible.

Preferably the enclosure includes guides 315 that will guide the printed circuit board and the cooling system cartridge into the chamber to mate with the connector 307. The board is preferably insertable and removable by hand. Alternatively, either a mechanical cam with an actuation lever can be used to dislodge the board, or a motorized device can dislodge and/or disgorge the board.

A closure, such as a door 317, is configured to close and seal the opening such that the chamber is sealed to contain cooling fluid in a liquid or gaseous state without leaking. Preferably the seal is adequate to allow the chamber to be evacuated. The connector 307 preferably electrically connects (i.e., allows electrical communication between) the printed circuit board and the other electrically active portions of the electronic device via a typical connector, such as a ribbon cable 119 or a connector that directly connects the enclosure to a backplane.

In some variations of the invention, it will be preferable to have a mechanism to provide for clearance between the sprayers and the chips when the board is guided into position. The mechanism can employ a guided board-insertion motion that is not coplanar with the card, such as an angled insertion pathway followed by a swinging motion to bring the board proximate the sprayers.

Alternatively, the mechanism can cause the sprayers to retract from the path of the board and its chips during their insertion and removal. The retraction mechanism could be manually activated by a technician, or it could be automatically activated upon the occurrence of an event such as the shutting down of the board or the opening of the enclosure. It could be mechanical or electro-mechanical. Furthermore, the mechanism could operate on the entire set of sprayers as a whole, or it could include individual retractors that each operates on a sprayer or group of sprayers, thus allowing for the board layout to be dealt with by the spray footprint, and the component heights to be dealt with by the flow rates, the variable height sprayers, or both.

In some cases, such as an automatic, electro-mechanical mechanism that operates separately on each sprayer or group thereof, the mechanism could be programmable to adjust to each chip's height, and preferably configured such that boards having similar layouts with different chip heights could be automatically adjusted to. The programming for such changes could even be carried in each board along with the layout information, thus making the system potentially a plug-and-play cooling system that immediately and automatically adjusts to the chip-heights of the inserted board.

The cooling system cartridge 309 is part of a spray cooling system that preferably includes a condenser (not shown) and a pump (not shown), and can include an external reservoir (not shown). The external reservoir, condenser and pump are preferably found outside the enclosure, and are preferably configured to process cooling fluid from a plurality of modules within the electronic device. As in the previous embodiment, an internal reservoir preferably adjoins the sprayers, and is preferably filled adequately with respect to the reservoir's orientation to keep connections with the sprayers submerged. The cooling fluid passes between the module and the external reservoir, condenser and pump via an inlet port 321 and an outlet port 323. Alternatively, a condenser and pump could be built into the module and directly or indirectly affixed to the enclosure. Depending on the orientation with respect to gravity, and on constraints of the electronic and fluid delivery systems, the inlet and/or outlet ports might be preferably located in other locations than shown in the figure, such as at the bottom of the enclosure.

The enclosure 305 is preferably configured to form a cooling-fluid retention basin 325 (i.e., a tray) that extends below the lowest point of the opening. The tray is configured to hold and retain all cooling fluid within the chamber 311 (with respect to gravity) when the board 301 or cooling system cartridge 309 is being inserted or extracted, or the system is otherwise not in use. It further serves to gather runoff spray and condensed vapor during operation, allowing that fluid to be cycled back through the system. To prepare the board for use, the system preferably includes vacuum system (not shown) that partially or entirely evacuates the chamber after the door is sealed over the orifice.

To upgrade a printed circuit board 301 or cooling system cartridge 309, or change a malfunctioning one, the board and its cooling system are deactivated. This preferably can occur with or without deactivating the remainder of the system of which they are a part. The door is opened or removed, with the vacuum seal (if one exists) being broken either before or when the door is opened. The board and/or cartridge are then removed, preferably by simply pulling to disengage from the connector. Alternatively, a cam with an actuation lever can be used to dislodge the board and/or cartridge. A new board and/or cartridge are then inserted and preferably pushed into place to engage with the connector. The guides 315 help to guide the replacement printed circuit board into the module along the appropriate path, and to the correct location. The door is closed or attached, and the vacuum is reestablished if cooling is to occur in a vacuum. The printed circuit board is then reactivated, and the cooling system cartridge is activated either prior to or concurrently with (or at least by the time it is needed after) the printed circuit board's activation.

Figure 8:
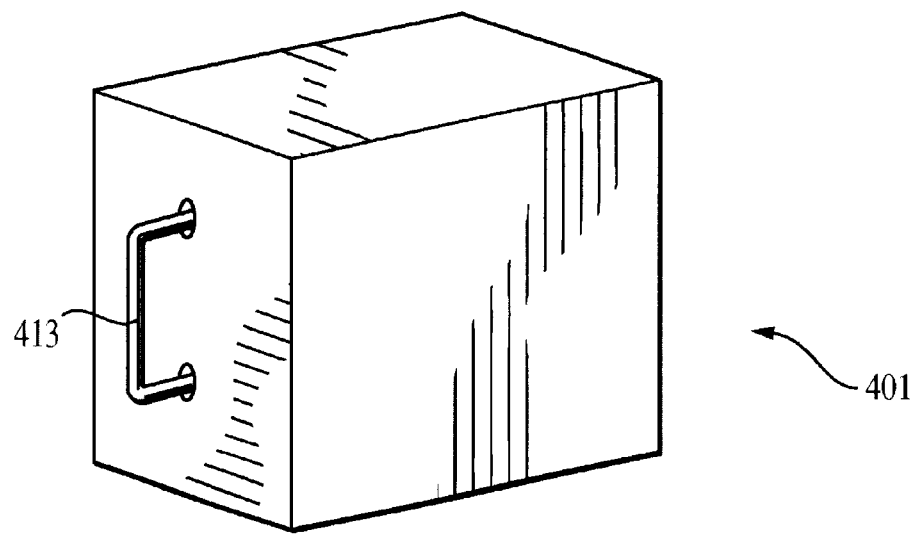
FIG. 8 is a perspective view of a second modular board system incorporating the spray cooling system depicted in FIG. 2.
Figure 9:
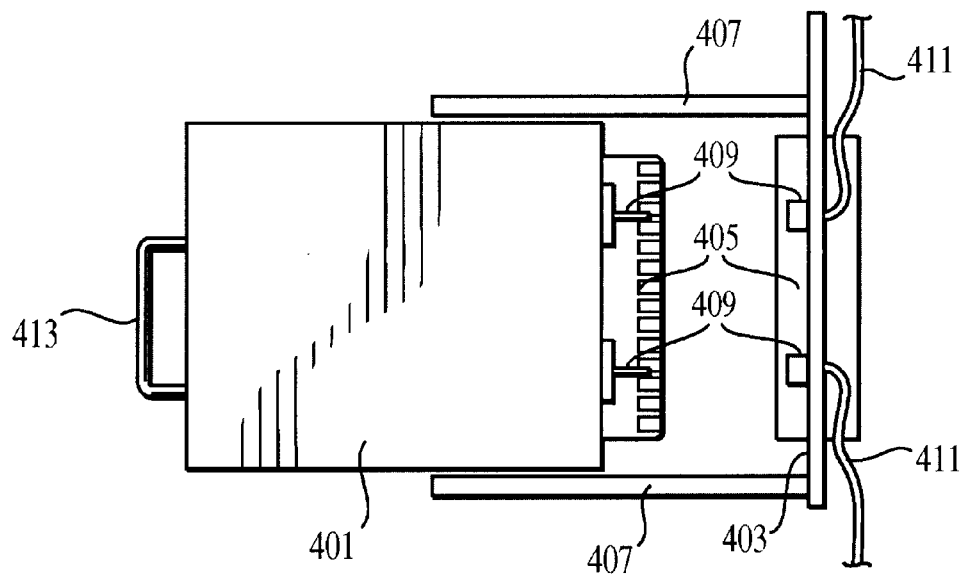
FIG. 9 is a side elevational view of the second modular board system as depicted in FIG. 8, being received by a portion of an electronic device.

With reference to FIGS. 8 and 9, in a third embodiment of the invention, a removable, preferably sealed, partially or totally self-contained modular sprayjet cooling system 401 connects to, and inserts into a bay 403 within a case of an electronic device such as a computer system via an appropriate mateable pair of quick-connect electrical connectors 405 (e.g., PC board connectors). The electronic device preferably includes a plurality of bays for receiving a plurality of such modules. The bays are preferably configured such that the modules can be inserted into and removed from the bays without any disassembly of the rest of the electronic device (or only insubstantial access-related activities such as opening an access door).

The module 401 preferably contains electrical and spray-cooling infrastructures (not shown) as described for the second embodiment, including the cooling system cartridge. While variations of the module could include a quick-release type of opening, it preferably includes a sealed opening of the type that would normally only be opened at a factory location during manufacture or refurbishment of the printed circuit board. Additionally, while the module could include a vacuum system to evacuate the chamber, preferably the chamber is evacuated when the board is installed, and the sealed chamber maintains the vacuum.

The electrical device includes support guides 407 such that this embodiment of modular sprayjet cooling system, along with its internal printed circuit board, can be easily inserted and connected to the electrical device. The module can include a condenser and/or pump to make the cooling system entirely self contained. Alternatively, the embodiment can include first and second fluid connection ports 409 to provide access to lines 411 that connect with an external condenser and/or pump. Preferably these fluid connection ports are configured as quick release connections, and preferably they seal when not connected to maintain an airtight seal both within the module and within the lines 411 that connect with an external condenser and/or pump. The fluid connection ports can be similar to those used in inkjet plotters. If the ports are used, the external condenser and/or pump are preferably configured to support a plurality of modules, which most likely all operate within the computer system.

To change a malfunctioning (or soon to be malfunctioning) printed circuit board, or to upgrade a printed circuit board, the entire module 401, including its board and cooling system, is deactivated. This preferably can occur with or without deactivating the remainder of the electronic device. The module is then grasped, preferably by a handle 413, and removed from the electronic device, preferably by simply pulling on the module to disengage the module from the electronic device's electrical connector 405 (and the fluid connection ports 409 if they are provided). Alternatively, a cam with an actuation lever can be provided and used to dislodge the module. A new module is then provided, inserted and preferably pushed into place to engage the connectors. The module is then reactivated, and the cooling system activates, either before or concurrently with (or slightly after) the board activation.

Preferred embodiments of the above-described invention can provide a sprayjet cooling system featuring a flexible fluid delivery scheme enabling operation with a variety of board configurations and chip heights. This scheme can be compatible with current ink jet (thermal or piezoelectric) cartridges for ease of manufacture and limited costs. Under the present invention, many embodiments will offer expedient serviceability of cartridges via quick disconnects.

It is to be understood that the invention comprises apparatus and methods for designing cooling systems and for producing cooling systems, as well as the apparatus and methods of the cooling system itself. Additionally, the various embodiments of the invention can incorporate various combinations of these features with computer systems and/or other systems incorporating spray cooling of hot components. Alternate variations of these embodiments could comprise other types of incremental sprayers, such as piezoelectric sprayers, or other spraying mechanisms. Also, the above apparatus and methods could be adapted for use with other types of heat-producing components, such as in optical devices and the like. In short, the above disclosed features can be combined in a wide variety of configurations within the anticipated scope of the invention.

Furthermore, embodiments of the invention can incorporate various combinations of the spray cooling apparatus described in U.S. Pat. No. 6,205,799, which is incorporated herein by reference for all purposes. For example, the cooling system can use pooling sensors, as are described in the patent. Likewise, a spring mechanism in the reservoir could be used to assist in the feeding of cooling fluid to the sprayers.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A cooling system for cooling one or more hot portions of one or more heat-producing components, the one or more hot portions covering sections of a target area, using information delineating the sections of the target area covered by the one or more hot portions, comprising:

a plurality of structurally interconnected spray-cooling nozzles configured to eject droplets of cooling fluid targeted throughout the target area; and a controller configured to use the information delineating the sections of the target area to control the operation of the plurality of nozzles such that a first group of the plurality of nozzles is substantially active and a second group of the plurality of nozzles is substantially inactive;

wherein the first group of the plurality of nozzles is targeted to cool the one or more hot portions of the one or more heat-producing components, and wherein the second group of the plurality of nozzles is targeted at sections of the target area not covered by the one or more hot portions of the one or more heat-producing components.

2. The cooling system of claim 1, wherein each of the plurality of nozzles is either in the first group of the plurality of nozzles or in the second group of the plurality of nozzles.

3. The cooling system of claim 1, wherein each of the plurality of nozzles are nozzles for incremental sprayers.

4. The cooling system of claim 1, wherein each of the plurality of nozzles are nozzles for thermal inkjet-type sprayers.

5. The cooling system of claim 1, and further comprising a reservoir adjoining the sprayers.

6. An electronic device comprising:
one or more heat-producing components; and
a cooling system as recited in claim 1, configured for cooling one or more hot portions of the one or more heat-producing components.

7. The electronic device of claim 6, and further comprising:
a second group of one or more heat-producing components;
a second cooling system as recited in claim 1, configured for cooling one or more hot portions of the second group of one or more heat-producing components; and
a condenser configured to remove heat from cooling fluid sprayed by both cooling systems.

8. The cooling system of claim 6, wherein each of the plurality of nozzles is attached to a planar substrate.

9. The cooling system of claim 6, wherein the controller is configured to accept new information delineating different sections of the target area to be cooled.

10. The cooling system of claim 1, and further comprising a controller;
wherein the first group of the plurality of nozzles includes
a first spray-cooling nozzle configured to eject droplets of cooling fluid targeted at a first hot portion of the one or more hot portions, and
a second spray-cooling nozzle configured to eject droplets of cooling fluid targeted at a second hot portion of the one or more hot portions; and
wherein the controller is configured to independently control the mass flow rates of the first and second spray-cooling nozzles in appropriate relation to the cooling needs of the first and second hot portions, respectively.

11. The cooling system of claim 10, wherein:
the first group of the plurality of nozzles further includes
a third spray-cooling nozzle configured to eject droplets of cooling fluid targeted at the first hot portion of the one or more hot portions, and
a fourth spray-cooling nozzle configured to eject droplets of cooling fluid targeted at the second hot portion of the one or more hot portions; and
the controller is configured to control the mass flow rates of the first and third spray-cooling nozzles independent from the mass flow rates of the second and fourth spray-cooling nozzles in appropriate relation to the cooling needs of the first and second heat-producing components, respectively.

12. The cooling system of claim 10, wherein each of the plurality of nozzles is attached to a planar substrate.

13. The cooling system of claim 10, wherein the controller is configured to accept new information delineating different sections of the target area to be cooled.

14. The cooling system of claim 1, wherein each of the plurality of nozzles is attached to a planar substrate.

15. The cooling system of claim 1, wherein the controller is configured to accept new information delineating different sections of the target area to be cooled.

16. A modular sprayjet cooling system for cooling one or more components on a board by spraying the one or more components with a cooling fluid during operation of the one or more components, comprising:
an enclosure defining an internal chamber, the chamber being configured to contain the board, wherein the chamber can be readily opened and closed by hand for external access to the chamber;
an electrical connector located within the chamber, the electrical connector being configured to electrically connect to the board to enable the operation of the one or more components; and
a cooling system as recited in claim 1 located within the chamber, the cooling system positioned such that the target area covers the one or more components;
wherein when the chamber is opened, the board can be readily removed and replaced; and
wherein when the chamber is closed, the chamber is sealed such that cooling fluid cannot leak out of the chamber.

17. The modular sprayjet cooling system of claim 16, and further comprising a condenser and a reservoir affixed to the enclosure.

18. The modular sprayjet cooling system of claim 16, and further comprising a condenser configured to condense cooling fluid received from a plurality of enclosures.

19. The modular sprayjet cooling system of claim 16, wherein each of the plurality of nozzles are nozzles for incremental sprayers.

20. The modular sprayjet cooling system of claim 16, wherein each of the plurality of nozzles are nozzles for thermal inkjet-type sprayers.

21. An electronic device comprising a modular sprayjet cooling system as recited in claim 16.

22. The electronic device of claim 21, and further comprising:
a second modular sprayjet cooling system as recited in claim 8; and
a condenser configured to remove heat from cooling fluid sprayed by both of the modular sprayjet cooling systems.

23. The cooling system of claim 16, wherein each of the plurality of nozzles is attached to a planar substrate.

24. The cooling system of claim 16, wherein the controller is configured to accept new information delineating different sections of the target area to be cooled.

25. A modular sprayjet cooling system for inserting into a bay of an electronic device, the bay having an electrical connector, the modular sprayjet cooling system configured to contain a board having one or more components, and configured for cooling the one or more components with a cooling fluid during operation of the one or more components, comprising:
an enclosure defining an internal chamber, the chamber being configured to contain the board, wherein the enclosure is configured to be releasably inserted into the bay;
a cooling system as recited in claim 1 located within the chamber, the cooling system positioned such that the target area covers the one or more components;
a first electrical connector located within the chamber, the first electrical connector being configured to electrically connect to the board; and
a second electrical connector located on the exterior of the enclosure, the second electrical connector being in electrical communication with the first electrical connector, wherein the second electrical connector is configured to mate with the electrical connector of the bay to place the board in communication with the electronic device via the first electrical connector;

wherein when the chamber is configured to be sealed such that cooling fluid cannot leak out of the chamber.

26. The modular sprayjet cooling system of claim 25, and further comprising fluid connection ports configured to connect the sprayer with a source of cooling fluid, and configured to provide the chamber with a cooling fluid outlet.

27. The modular sprayjet cooling system of claim 25, and further comprising a condenser and a reservoir affixed to the enclosure.

28. The modular sprayjet cooling system of claim 25, and further comprising a condenser configured to condense cooling fluid received from a plurality of enclosures.

29. The modular sprayjet cooling system of claim 25, wherein the sprayer is an incremental sprayer.

30. The modular sprayjet cooling system of claim 25, wherein each of the plurality of nozzles are nozzles for incremental sprayers.

31. The modular sprayjet cooling system of claim 25, wherein each of the plurality of nozzles are nozzles for thermal inkjet-type sprayers.

32. A modular electronic device comprising:
a board having one or more components; and
a modular sprayjet cooling system as recited in claim 25, configured for cooling the one or more components with a cooling fluid during operation of the one or more components.

33. An electronic device comprising:
a modular electronic device as recited in claim 32; and
one or more additional components configured to electronically interact with the one or more components of the modular electronic device.

34. The electronic device of claim 33, and further comprising:
a second modular electronic device as recited in claim 32; and
a condenser configured to remove heat from cooling fluid sprayed by the plurality of nozzles of each modular electronic device.

35. The cooling system of claim 25, wherein each of the plurality of nozzles is attached to a planar substrate.

36. The cooling system of claim 25, wherein the controller is configured to accept new information delineating different sections of the target area to be cooled.

37. A cooling system for cooling one or more hot portions of one or more heat-producing components, the one or more hot portions covering sections of a target area, using information delineating the sections of the target area covered by the one or more hot portions, comprising:
a means for spraying cooling fluid targeted throughout the target area; and
a means for controlling the operation of the means for spraying, using the information delineating the sections of the target area, such that the means for spraying sprays the one or more hot portions of the one or more heat-producing components, and wherein means for spraying does not substantially spray the sections of the target area that are not covered by the one or more hot portions of the one or more heat-producing components.

38. A method for cooling one or more hot portions of one or more heat-producing components, the one or more hot portions covering sections of a target area, using information delineating the sections of the target area covered by the one or more hot portions, comprising:
providing a means for spraying cooling fluid targeted throughout the target area; and
controlling the operation of the means for spraying, using the information delineating the sections of the target area, such that the means for spraying sprays the one or more hot portions of the one or more heat-producing components, and wherein means for spraying does not substantially spray the sections of the target area that are not covered by the one or more hot portions of the one or more heat-producing components.

39. A cooling system for cooling a first heat-producing component and a second heat-producing component, comprising:
a first spray-cooling nozzle configured to eject droplets of cooling fluid targeted at the first heat-producing component;
a second spray-cooling nozzle configured to eject droplets of cooling fluid targeted at the second heat-producing component; and
a controller configured to independently control the mass flow rates of the first and second spray-cooling nozzles in appropriate relation to the cooling needs of the first and second heat-producing components, respectively;
wherein each of the nozzles are nozzles for incremental sprayers.

40. A cooling system for cooling a first heat-producing component and a second heat-producing component, comprising:
a first spray-cooling nozzle configured to eject droplets of cooling fluid targeted at the first heat-producing component;
a second spray-cooling nozzle configured to eject droplets of cooling fluid targeted at the second heat-producing component; and
a controller configured to independently control the mass flow rates of the first and second spray-cooling nozzles in appropriate relation to the cooling needs of the first and second heat-producing components, respectively;
wherein each of the nozzles are nozzles for thermal inkjet-type sprayers.

41. A cooling system for cooling a first heat-producing component and a second component, comprising:
a first spray-cooling nozzle configured to eject droplets of cooling fluid targeted at the first heat-producing component;
a second spray-cooling nozzle configured to eject droplets of cooling fluid targeted at the second heat-producing component;
a controller configured to independently control the mass flow rates of the first and second spray-cooling nozzles in appropriate relation to the cooling needs of the first and second heat-producing components, respectively; and
a third spray-cooling nozzle configured to eject droplets of cooling fluid targeted in the same general direction as at least one of the first and second spray-cooling nozzles;
wherein the third spray-cooling nozzle is configured such that it is not targeted at a heat-producing component when the first and second spray-cooling nozzles are targeted at the first and second heat-producing components, respectively;
wherein the third spray-cooling nozzle is configured to eject droplets of cooling fluid in response to a command from the controller; and
wherein the controller is configured such that it does not command the third spray-cooling nozzle to spray.

* * * * *